(12) United States Patent
Sato

(10) Patent No.: US 6,580,274 B2
(45) Date of Patent: Jun. 17, 2003

(54) RF COIL AND MAGNETIC RESONANCE IMAGING APPARATUS

(75) Inventor: Kenji Sato, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 80 days.

(21) Appl. No.: 09/814,141

(22) Filed: Mar. 21, 2001

(65) Prior Publication Data

US 2001/0035754 A1 Nov. 1, 2001

(30) Foreign Application Priority Data

Apr. 26, 2000 (JP) .......................................... 2000-125490

(51) Int. Cl.[7] ................................................. G01V 3/00

(52) U.S. Cl. ........................ 324/318; 324/307; 324/309; 324/322

(58) Field of Search .............................. 324/318, 309, 324/322, 307, 312; 600/422

(56) References Cited

U.S. PATENT DOCUMENTS

| | | | | | |
|---|---|---|---|---|---|
| 4,968,937 A | * | 11/1990 | Akgun | ........................ | 324/318 |
| 4,985,680 A | | 1/1991 | Maeda et al. | ................. | 324/322 |
| 5,075,624 A | * | 12/1991 | Bexjak | ........................ | 324/318 |
| 5,581,187 A | * | 12/1996 | Pausch | ........................ | 324/318 |
| 6,215,307 B1 | * | 4/2001 | Sementchenko | ............ | 324/318 |
| 6,249,121 B1 | * | 6/2001 | Boskamp et al. | ........... | 324/318 |
| 6,414,485 B1 | * | 7/2002 | Kato et al. | .................... | 324/307 |
| 2001/0035754 A1 | * | 11/2001 | Sato | ........................... | 324/318 |

FOREIGN PATENT DOCUMENTS

| | | |
|---|---|---|
| EP | 0459569 | 12/1991 |
| JP | 8322816 | 4/1997 |
| JP | 9201346 | 8/1997 |

* cited by examiner

*Primary Examiner*—Edward Lefkowitz
*Assistant Examiner*—Tiffany A. Fetzner
(74) *Attorney, Agent, or Firm*—Moonray Kojima

(57) ABSTRACT

An RF coil is intended to prevent the bias current of disable circuits from adversely affecting a static magnetic field. The disable circuits are each a parallel connection of a capacitor and a serial circuit of an inductor and a diode, and are connected in series to the coil loop, on which points of equal RF potential are interconnected by RF choke circuits to form a d.c. bias feed path for the diodes.

16 Claims, 14 Drawing Sheets

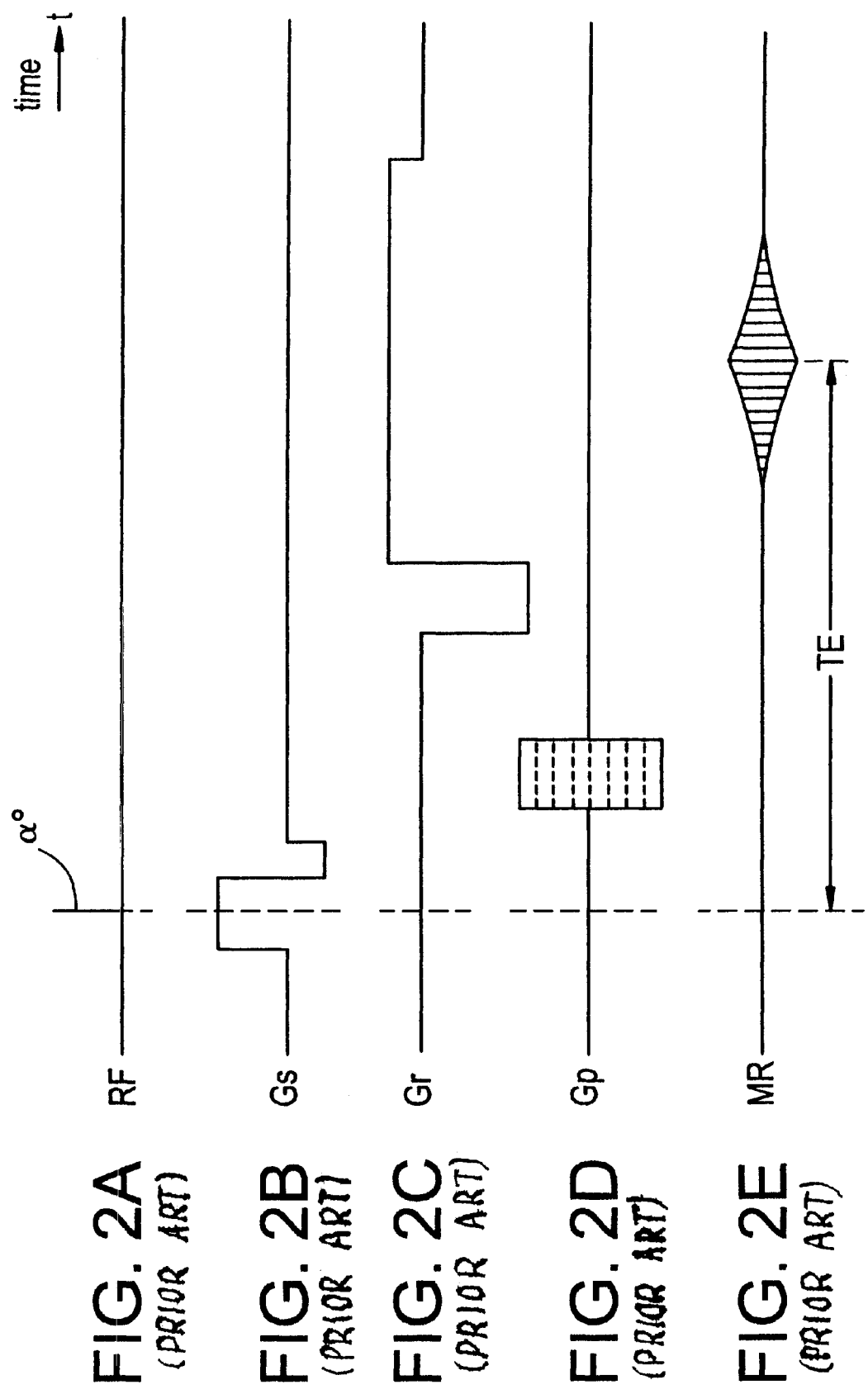

FIG. 4
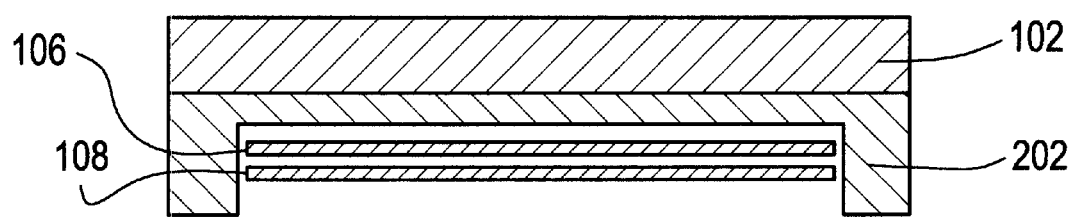
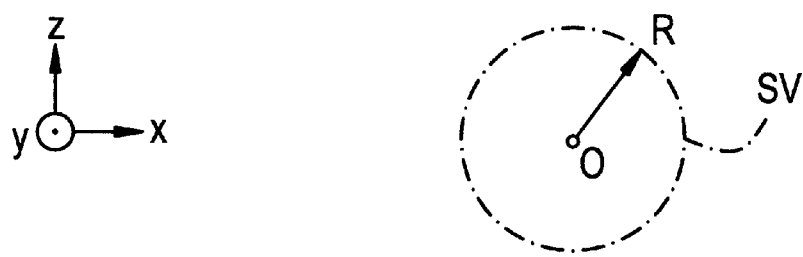
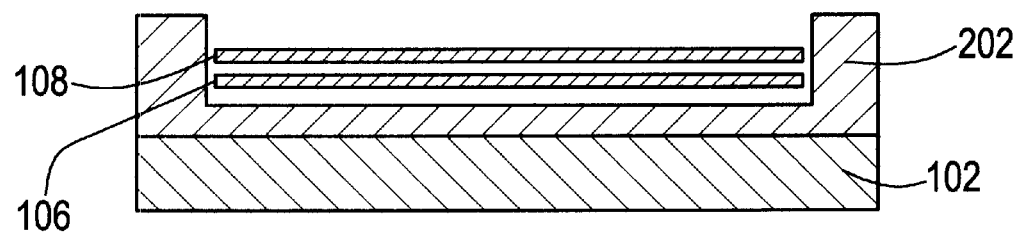

RF COIL AND MAGNETIC RESONANCE IMAGING APPARATUS

BACKGROUND OF THE INVENTION

The present invention relates to an RF coil (radio frequency coil) and a magnetic resonance imaging apparatus, and particularly to an RF coil having disable circuits which preclude the RF coil from coupling with other coils and a magnetic resonance imaging apparatus using this RF coil.

The magnetic resonance imaging (MRI) apparatus operates to apply a gradient magnetic field and an RF magnetic field to a subject of imaging which is placed in the internal space of a magnet system, i.e., the space where a static magnetic field is formed, so that a magnetic resonance signal is generated in the subject, and form (recompose) a tomographic image based on a received magnetic resonance signal.

An RF coil is used for the application of RF magnetic field and the reception of magnetic resonance signal. In case the application of RF magnetic field and reception of magnetic resonance signal are implemented with separate RF coils, disable circuits which preclude the coupling of these coils are provided for each of the sending coil and receiving coil.

Each disable circuit is formed as a parallel connection of a capacitor and a serial circuit of an inductor and a diode.

A d.c. forward bias signal is used to turn on the diodes thereby to form LC circuits, and their high-impedance state caused by the parallel resonation is utilized to disable the RF coil, thereby performing the decoupling. A d.c. reverse bias signal is used to turn off the diodes thereby to dissolve the parallel connection of the capacitor and diode and enable the RF coil, thereby allowing the transmission or reception of the RF signal. The receiving coil is disabled when the RF signal is transmitted, and the sending coil is disabled when the magnetic resonance signal is received.

Supplying the d.c. bias signal from the feed point of the RF signal by the common use of the RF signal feed line is advantageous in reducing signal lines, however, the d.c. bias current flowing through the main loop of the RF coil and thus forming a d.c. magnetic field will deteriorate the accuracy of the static magnetic field.

SUMMARY OF THE INVENTION

An object of the present invention is the accomplishment of an RF coil which does not suffer the adverse influence of the bias current of the disable circuits on the static magnetic field, and a magnetic resonance imaging apparatus using this RF coil.

(1) The invention at a first viewpoint intending to solve the above-mentioned problem resides in an RF coil having disable circuits, each of which is a parallel connection of a capacitor and a serial circuit of an inductor and a diode and is connected in series to the coil loop, and being characterized by including RF choke circuits which form a d.c. bias feed path for the diodes by connecting points of equal RF potential on the coil loop.

The invention at this viewpoint is designed to arrange a bias feed circuit of the disable circuit based on the connection of points of equal RF potential on the coil loop through RF choke circuits. Accordingly, the d.c. bias current flows through the RF choke circuits instead of the main loop of the RF coil, while the RF signal goes through the main loop instead of the RF choke circuits, and consequently it is possible to feed the d.c. bias current and RF signal at the same point.

(2) The invention at other viewpoint intending to solve the above-mentioned problem resides in an RF coil of the item (1), which is characterized by including a plurality of linear main current paths lying in parallel to each other on a plane, and roundabout current paths which lie round beside the main current paths on the plane to connect the main current paths in series so that the main current paths have a same current direction, and having the disable circuits lying on the roundabout current paths.

The invention at this viewpoint is designed to dispose the disable circuits on the roundabout current paths of the coil loop, and consequently a magnetic field created by the d.c. bias current does not affect the static magnetic field of the imaging space.

(3) The invention at other viewpoint intending to solve the above-mentioned problem resides in an RF coil of the item (1), which is characterized by including first current paths which include a plurality of linear current paths lying in parallel to each other on a plane, second current paths which include a plurality of linear current paths lying in parallel to each other, and lie on the plane to have a parallel mirror-image relation with the first current paths, and third current paths which lie round beside the first and second current paths along the plane to connect all linear current paths of the first and second current paths in series so that the linear current paths have a same current direction, and having the disables circuits lying on the third current paths.

The invention at this viewpoint is designed to dispose the disable circuits on the third current paths, i.e., the roundabout current paths, of the coil loop, and consequently a magnetic field created by the d.c. bias current does not affect the static magnetic field of the imaging space.

(4) The invention at other viewpoint intending to solve the above-mentioned problem resides in an RF coil of the item (1), which is characterized by including first current paths which include a plurality of linear current paths lying in parallel to each other on a first plane, second current paths which include a plurality of linear current paths lying in parallel to each other, and lie on the first plane to have a parallel mirror-image relation with the first current paths, third current paths which lie round beside the first and second current paths along the first plane to connect all linear current paths of the first and second current paths in series so that the linear current paths have a same current direction, fourth current paths which include a plurality of linear current paths lying in parallel to the current path direction of the first current paths on a second plane which confronts the first plane in parallel by being spaced out therefrom, fifth current paths which include a plurality of linear current paths lying in parallel to each other, and lie on the second plane to have a parallel mirror-image relation with the fourth current paths, and sixth current paths which lie round beside the fourth and fifth current paths along the second plane to connect all linear current paths of the fourth and fifth current paths in series so that the linear current paths have the same current direction, and having the disable circuits lying on the third and sixth current paths.

The invention at this viewpoint is designed to dispose the disable circuits on the third and sixth current paths, i.e., the roundabout current paths, of the coil loop, and consequently a magnetic field created by the d.c. bias current does not affect the static magnetic field of the imaging space.

(5) The invention at other viewpoint intending to solve the above-mentioned problem resides in an RF coil of the item (1), which is characterized by including first current paths which include a plurality of linear current paths lying in parallel to each other on a first plane, second current paths which include a plurality of linear current paths lying in parallel to each other, and lie on the first plane to have a parallel mirror-image relation with the first current paths, third current paths which lie round beside the first and second current paths along the first plane to connect all linear current paths of the first and second current paths in series so that the linear current paths have a same current direction, seventh current paths which include a plurality of linear current paths lying in parallel to each other along the direction perpendicular to the current path direction of the first current paths on a third plane which confronts the first plane in parallel and in close vicinity thereto, eighth current paths which include a plurality of linear current paths lying in parallel to each other, and lie on the third plane to have a parallel mirror-image relation with the seventh current paths, and ninth current paths which lie round beside the seventh and eighth current paths along the third plane to connect all linear current paths of the seventh and eighth current paths in series so that the linear current paths have a same current direction, and having the disable circuits lying on the third and ninth current paths.

The invention at this viewpoint is designed to dispose the disable circuits on the third and ninth current paths, i.e., the roundabout current paths, of the coil loop, and consequently a magnetic field created by the d.c. bias current does not affect the static magnetic field of the imaging space.

(6) The invention at other viewpoint intending to solve the above-mentioned problem resides in an RF coil of the item (1), which is characterized by including first current paths which include a plurality of linear current paths lying in parallel to each other on a first plane, second current paths which include a plurality of linear current paths lying in parallel to each other, and lie on the first plane to have a parallel mirror-image relation with the first current paths, third current paths which lie round beside the first and second current paths along the first plane to connect all linear current paths of the first and second current paths in series so that the linear current paths have a same current direction, seventh current paths which include a plurality of linear current paths lying in parallel to each other along the direction perpendicular to the current path direction of the first current paths on a third plane which confronts the first plane in parallel and in close vicinity thereto, eighth current paths which include a plurality of linear current paths lying in parallel to each other, and lie on the third plane to have a parallel mirror-image relation with the seventh current paths, ninth current paths which lie round beside the seventh and eighth current paths along the third plane to connect all linear current paths of the seventh and eighth current paths in series so that the linear current paths have a same current direction, fourth current paths which include a plurality of linear current paths lying in parallel to the current path direction of the first current paths on a second plane which confronts the first plane in parallel by being spaced out therefrom, fifth current paths which include a plurality of linear current paths lying in parallel to each other, and lie on the second plane to have a parallel mirror-image relation with the fourth current paths, sixth current paths which lie round beside the fourth and fifth current paths along the second plane to connect all linear current paths of the fourth and fifth current paths in series so that the linear current paths have the same current direction, tenth current paths which include a plurality of linear current paths lying in parallel to each other along the direction perpendicular to the current path direction of the fourth current paths on a fourth plane which confronts the second plane in parallel and in close vicinity thereto, eleventh current paths which include a plurality of linear current paths lying in parallel to each other, and lie on the fourth plane to have a parallel mirror-image relation with the tenth current paths, and twelfth current paths which lie round beside the tenth and eleventh current paths along the fourth plane to connect all linear current paths of the tenth and eleventh current paths in series so that the linear current paths have the same current direction, and having the disable circuits lying on the third, sixth, ninth and twelfth current paths.

The invention at this viewpoint is designed to dispose the disable circuits on the third, sixth, ninth and twelfth paths, i.e., the roundabout current paths, of the coil loop, and consequently a magnetic field created by the d.c. bias current does not affect the static magnetic field of the imaging space.

(7) The invention at other viewpoint intending to solve the above-mentioned problem resides in an RF coil of any one of the items (1) through (6), which is characterized in that the RF choke circuit comprises an inductor.

The invention at this viewpoint is designed to use an inductor as an RF choke circuit, and consequently a signal transmission path having large impedance values in the RF domain and small resistance values in the d.c. domain can be accomplished.

(8) The invention at other viewpoint intending to solve the above-mentioned problem resides in an RF coil of any one of the items (1) through (6), which is characterized in that the RF choke circuit comprises a parallel circuit of an inductor and a capacitor.

The invention at this viewpoint is designed to use a parallel circuit of an inductor and a capacitor as an RF choke circuit, and consequently a signal transmission path having large impedance values in the RF domain and small resistance values in the d.c. domain can be accomplished.

(9) The invention at other viewpoint intending to solve the above-mentioned problem resides in an RF coil of any one of the items (1) through (6), which is characterized in that the RF choke circuit comprises a serial circuit of an inductor and a diode.

The invention at this viewpoint is designed to use a serial circuit of an inductor and a diode as an RF choke circuit, and consequently a signal transmission path having large impedance values in the RF domain and small resistance values in the d.c. domain can be accomplished.

(10) The invention at other viewpoint intending to solve the above-mentioned problem resides in a magnetic resonance imaging apparatus for forming an image based on a magnetic resonance signal which is acquired by use of a static magnetic field, gradient magnetic field and RF magnetic field, and is characterized by including an RF coil which generates the RF magnetic field and has disable circuits each of which is a parallel connection of a capacitor and a serial circuit of an inductor and a diode and is connected in series to the coil loop, and further has RF choke circuits which form a d.c. bias feed path for the diodes by connecting points of equal RF potential on the coil loop.

The invention at this viewpoint is designed to provide the RF coil for generating the RF magnetic field with a bias feed path of the disable circuit based on the connection of points of equal RF potential on the coil loop through RF choke circuits. Accordingly, the d.c. bias current flows through the RF choke circuits instead of the main loop of the RF coil, while the RF signal goes through the main loop instead of the RF choke circuits, and consequently it is possible to feed the d.c. bias current and RF signal at the same point.

(11) The invention at other viewpoint intending to solve the above-mentioned problem resides in a magnetic resonance imaging apparatus of the item (10), which is characterized in that the RF coil includes a plurality of linear main current paths lying in parallel to each other on a plane, and roundabout current paths which lie round beside the main current paths on the plane to connect the main current paths in series so that the main current paths have a same current direction, and has the disable circuits lying on the roundabout current paths.

The invention at this viewpoint is designed to dispose the disable circuits on the roundabout current paths of the coil loop, and consequently a magnetic field created by the d.c. bias current does not affect the static magnetic field of the imaging space.

(12) The invention at other viewpoint intending to solve the above-mentioned problem resides in a magnetic resonance imaging apparatus of the item (10), which is characterized in that the RF coil includes a first current paths which include a plurality of linear current paths lying in parallel to each other on a plane, second current paths which include a plurality of linear current paths lying in parallel to each other, and lie on the plane to have a parallel mirror-image relation with the first current paths, and third current paths which lie round beside the first and second current paths along the plane to connect all linear current paths of the first and second current paths in series so that the linear current paths have a same current direction, and has the disable circuits lying on the third current paths.

The invention at this viewpoint is designed to dispose the disable circuits on the third current paths, i.e., the roundabout current paths, of the coil loop, and consequently a magnetic field created by the d.c. bias current does not affect the static magnetic field of the imaging space.

(13) The invention at other viewpoint intending to solve the above-mentioned problem resides in a magnetic resonance imaging apparatus of the item (10), which is characterized in that the RF coil includes a first current paths which include a plurality of linear current paths lying in parallel to each other on a first plane, second current paths which include a plurality of linear current paths lying in parallel to each other, and lie on the first plane to have a parallel mirror-image relation with the first current paths, third current paths which lie round beside the first and second current paths along the first plane to connect all linear current paths of the first and second current paths in series so that the linear current paths have a same current direction, fourth current paths which include a plurality of linear current paths lying in parallel to the current path direction of the first current paths on a second plane which confronts the first plane in parallel by being spaced out therefrom, fifth current paths which include a plurality of linear current paths lying in parallel to each other, and lie on the second plane to have a parallel mirror-image relation with the fourth current paths, and sixth current paths which lie round beside the fourth and fifth current paths along the second plane to connect all linear current paths of the fourth and fifth current paths in series so that the linear current paths have the same current direction, and has the disable circuits lying on the third and sixth current paths.

The invention at this viewpoint is designed to dispose the disable circuits on the third and sixth current paths, i.e., the roundabout current paths, of the coil loop, and consequently a magnetic field created by the d.c. bias current does not affect the static magnetic field of the imaging space.

(14) The invention at other viewpoint intending to solve the above-mentioned problem resides in a magnetic resonance imaging apparatus of the item (10), which is characterized in that the RF coil includes a first current paths which include a plurality of linear current paths lying in parallel to each other on a first plane, second current paths which include a plurality of linear current paths lying in parallel to each other, and lie on the first plane to have a parallel mirror-image relation with the first current paths, third current paths which lie round beside the first and second current paths along the first plane to connect all linear current paths of the first and second current paths in series so that the linear current paths have a same current direction, seventh current paths which include a plurality of linear current paths lying in parallel to each other along the direction perpendicular to the current path direction of the first current paths on a third plane which confronts the first plane in parallel and in close vicinity thereto, eighth current paths which include a plurality of linear current paths lying in parallel to each other, and lie on the third plane to have a parallel mirror-image relation with the seventh current paths, and ninth current paths which lie round beside the seventh and eighth current paths along the third plane to connect all linear current paths of the seventh and eighth current paths in series so that the linear current paths have a same current direction, and has the disable circuits lying on the third and ninth current paths.

The invention at this viewpoint is designed to dispose the disable circuits on the third and ninth current paths, i.e., the roundabout current paths, of the coil loop, and consequently a magnetic field created by the d.c. bias current does not affect the static magnetic field of the imaging space.

(15) The invention at other viewpoint intending to solve the above-mentioned problem resides in a magnetic resonance imaging apparatus of the item (10), which is characterized in that the RF coil includes a first current paths which include a plurality of linear current paths lying in parallel to each other on a first plane, second current paths which include a plurality of linear current paths lying in parallel to each other, and lie on the first plane to have a parallel mirror-image relation with the first current paths, third current paths which lie round beside the first and second current paths along the first plane to connect all linear current paths of the first and second current paths in series so that the linear current paths have a same current direction, seventh current paths which include a plurality of linear current paths lying in parallel to each other along the direction perpendicular to the current path direction of the first current paths on a third plane which confronts the first plane in parallel and in close vicinity thereto, eighth current paths which include a plurality of linear current paths lying in parallel to each other, and lie on the third plane to have a parallel mirror-image relation with the seventh current paths, ninth current paths which lie round beside the seventh and eighth current paths along the third plane to connect all linear current paths of the seventh and eighth current paths in series so that the linear current paths have a same current direction, fourth current paths which include a plurality of linear current paths lying in parallel to the current path direction of the first current paths on a second plane which confronts the first plane in parallel by being spaced out therefrom, fifth current paths which include a plurality of linear current paths lying in parallel to each other, and lie on the second plane to have a parallel mirror-image relation with the fourth current paths, sixth current paths which lie round beside the fourth and fifth current paths along the second plane to connect all linear current paths of the fourth and fifth current paths in series so that the linear current paths have the same current direction, tenth current paths which include a plurality of linear current paths lying in parallel to each other along the direction perpendicular to the current path direction of the fourth current paths on a fourth plane which confronts the second plane in parallel and in close vicinity thereto, eleventh current paths which include a plurality of linear current paths lying in parallel to each other, and lie on the fourth plane to have a parallel mirror-image relation with the tenth current paths, and twelfth current paths which lie round beside the tenth and eleventh current paths along the fourth plane to connect all linear current paths of the tenth and eleventh current paths in series so that the linear current paths have the same current direction, and has the disable circuits lying on the third, sixth, ninth and twelfth current paths.

The invention at this viewpoint is designed to dispose the disable circuits on the third, sixth, ninth and twelfth current paths, i.e., the roundabout current paths, of the coil loop, and consequently a magnetic field created by the d.c. bias current does not affect the static magnetic field of the imaging space.

(16) The invention at other viewpoint intending to solve the above-mentioned problem resides in a magnetic resonance imaging apparatus of any one of the items (10) through (15), which is characterized in that the RF choke circuit comprises an inductor.

The invention at this viewpoint is designed to use an inductor as an RF choke circuit, and consequently a signal transmission path having large impedance values in the RF domain and small resistance values in the d.c. domain can be accomplished.

(17) The invention at other viewpoint intending to solve the above-mentioned problem resides in a magnetic resonance imaging apparatus of any one of the items (10) through (15), which is characterized in that the RF choke circuit comprises a parallel circuit of an inductor and a capacitor.

The invention at this viewpoint is designed to use a parallel circuit of an inductor and a capacitor as an RF choke circuit, and consequently a signal transmission path having large impedance values in the RF domain and small resistance values in the d.c. domain can be accomplished.

(18) The invention at other viewpoint intending to solve the above-mentioned problem resides in a magnetic resonance imaging apparatus of any one of the items (10) through (15), which is characterized in that the RF choke circuit comprises a serial circuit of an inductor and a diode.

The invention at this viewpoint is designed to use a serial circuit of an inductor and a diode as an RF choke circuit, and consequently a signal transmission path having large impedance values in the RF domain and small resistance values in the d.c. domain can be accomplished.

Therefore, the present invention can accomplish RF coils which prevent the bias current of the disable circuits from adversely affecting the static magnetic field, and magnetic resonance imaging apparatus having the RF coils.

Further objects and advantages of the present invention will be apparent from the following description of the preferred embodiments of the invention as illustrated in the accompanying drawings.

BRIEF DESCRIPTION OF THE DRAWINGS

FIG. 2 is a diagram showing an example of pulse sequences implemented by the apparatus shown in FIG. 1.

FIG. 4 is a schematic diagram showing the structure of the neighborhood of the sending coil section of the apparatus shown in FIG. 1.

DETAILED DESCRIPTION OF THE INVENTION

Figure 1:
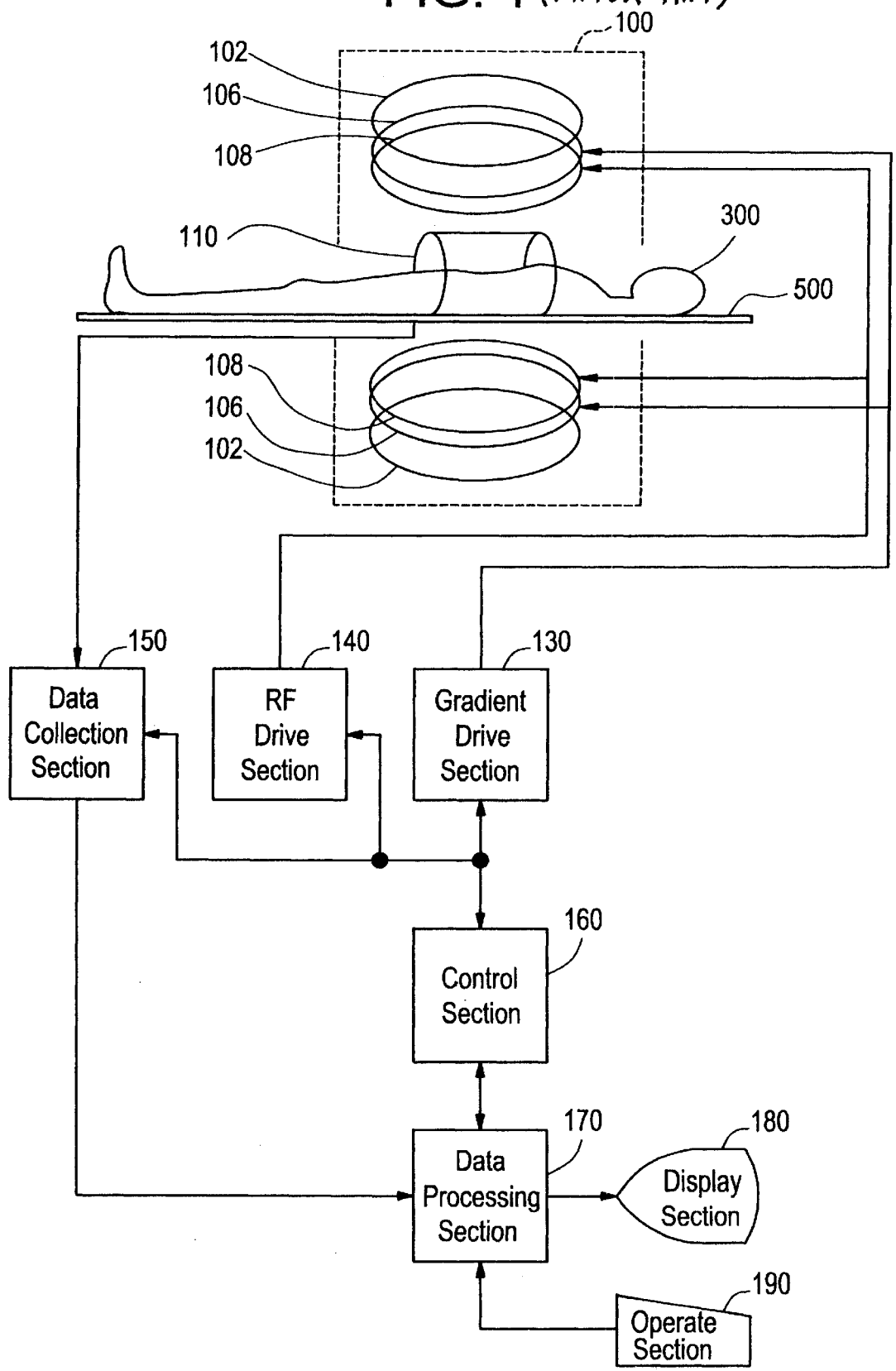
FIG. 1 is a block diagram of an apparatus based on an embodiment of this invention.
Figures 3A, 3B, 3C, 3D, 3E:
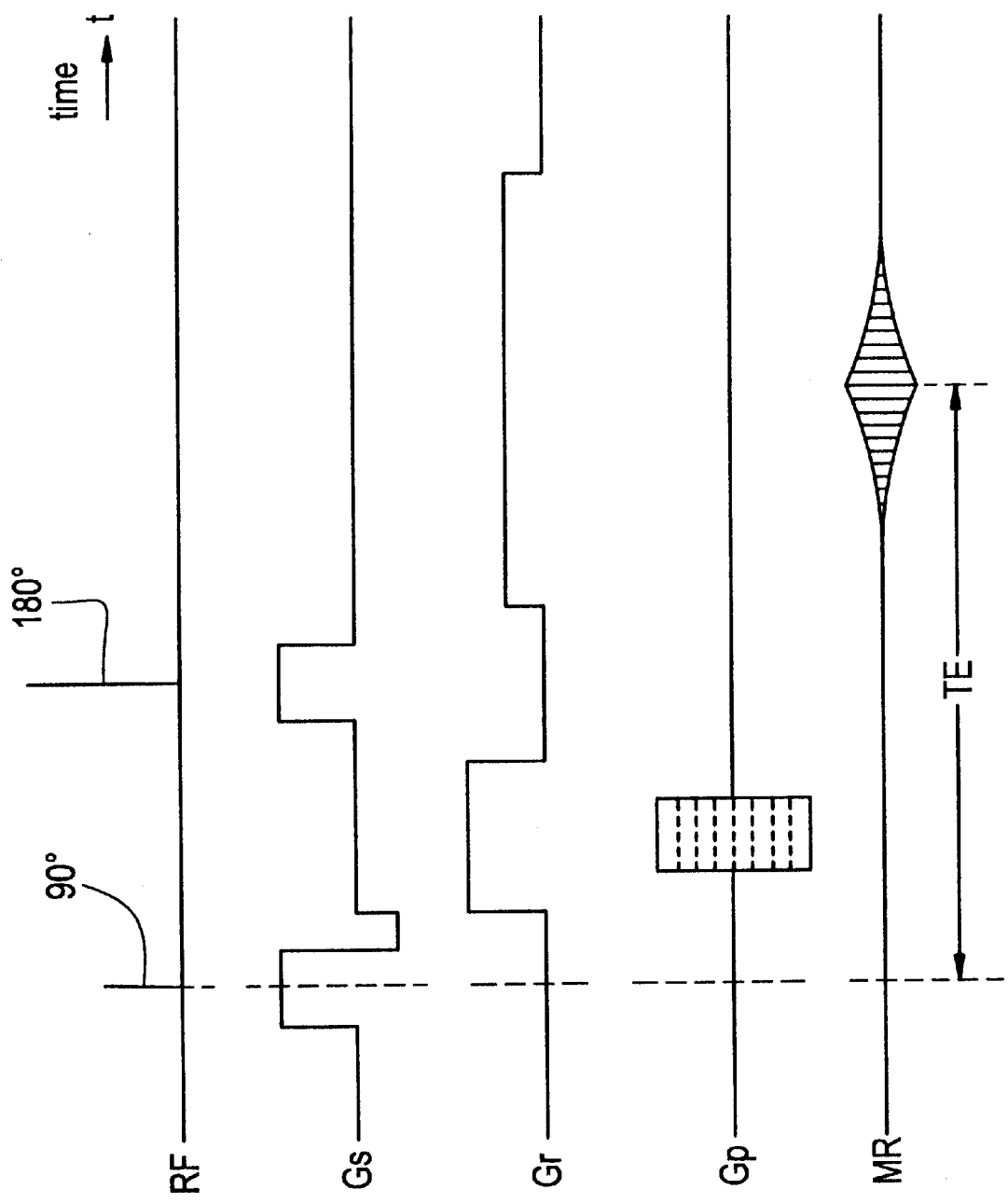
FIG. 3 is a diagram showing an example of pulse sequences implemented by the apparatus shown in FIG. 1.

Embodiments of the present invention will be explained in detail with reference to the drawings. FIG. 1 shows by block diagram a magnetic resonance imaging apparatus, which is an example of embodiment of this invention. The arrangement of this apparatus exhibits an example of embodiment of the inventive apparatus.

As shown in FIG. 1, this apparatus includes a magnet system 100. The magnet system 100 includes a magnet section 102 for a main magnetic field, a gradient coil section 106 and a sending coil section 108. These main-field magnet section 102 and coil sections are each arranged in pairs to confront each other by being interposed by a space. These devices having a generally disc-like shape are disposed along a common center axis. The magnet system 100 has an internal space (bore) where a subject 300 placed on a cradle 500 is carried in and out by a carriage means (not shown). A receiving coil section 110 is put on the imaging portion of the subject 300.

The main-field magnet section 102 forms a static magnetic field in the bore of the magnet system 100. The static magnetic field is oriented to be virtually orthogonal to the body axis of the subject 300. Namely, it is so-called a vertical magnetic field. The main-field magnet section 102 is made up of permanent magnets for example. It is obviously possible to use magnets of the superconduction type or ordinary conduction type, instead of the permanent magnets.

The gradient coil section 106 produces a gradient magnetic field which causes the static magnetic field to have a gradient. The produced gradient magnetic field consists of a slice gradient magnetic field, a read-out gradient magnetic field and a phase encode gradient magnetic field. The gradient coil section 106 includes gradient coils of three systems (not shown) in correspondence to these three kinds of gradient magnetic field.

The gradient coils of three systems generate three gradient magnetic fields for rendering gradients to the static magnetic field in three directions which are orthogonal to one another. Among the three directions, one is of the static magnetic field (vertical direction), which is defined to be the z direction in general. Other one is the horizontal direction, which is defined to be the y direction in general. The remaining one is the direction perpendicular to the y direction, and it is defined to be the x direction in general. The x direction is perpendicular to the z direction on a vertical plane, and perpendicular to the y direction on a horizontal plane.

The sending coil section 108 transmits an RF excitation signal for inducing a spin in the body of the subject 300 into the space of static magnetic field. The sending coil section 108 is an example of embodiment of the inventive RF coil. The sending coil section 108 will be explained in detail later.

The gradient coil section 106 is connected with a gradient drive section 130. The gradient drive section 130 supplies a drive signal to the gradient coil section 106, which then generates a gradient magnetic field. The gradient drive section 130 has drive circuits of three systems (not shown) in correspondence to the gradient coils of three systems of the gradient coil section 106.

The sending coil section 108 is connected with an RF drive section 140. The RF drive section 140 supplies a drive signal to the sending coil section 108, which then transmits an RF excitation signal to induce a spin in the body of the subject 300. The RF drive section 140 also supplies a bias signal to disable circuits, which will be explained later, included in the sending coil section 108.

The receiving coil section 110 receives a magnetic resonance signal produced by the induced spin. The receiving coil section 110 is connected with a data collecting section 150. The data collecting section 150 fetches signals received by the receiving coil section 110, thereby accumulating view data.

The gradient drive section 130, RF drive section 140 and data collecting section 150 are connected with a control section 160. The control section 160 controls the gradient drive section 130, RF drive section 140 and data collecting section 150 to implement the imaging.

The data collecting section 150 has its output connected to a data processing section 170. The data processing section 170 is a computer for example. The data processing section 170 has a memory (not shown). The memory stores programs and various data used by the data processing section 170. The function of this apparatus is accomplished by the execution of programs in the memory by the data processing section 170.

The data processing section 170 store data, which has been fetched from the data collecting section 150, into the memory. A data space is formed in the memory. The data space is a 2-degree Fourier space. The data processing section 170 implements the inverse 2-degree Fourier transformation for the data of the 2-degree Fourier space thereby to produce (recompose) an image of the subject 300. The 2-degree Fourier space is also called a k-space.

The data processing section 170 is connected to the control section 160. The data processing section 170 ranks above the control section 160, and administers it. The data processing section 170 is further connected with a display section 180 and operation section 190. The display section 180 is a graphic display unit or the like. The operation section 190 is a keyboard or the like equipped with a pointing device.

The display section 180 displays a recomposed image and various information released by the data processing section 170. The operation section 190 is operated by the operator for entering various commands and information to the data processing section 170. The operator operates the apparatus in an interactive manner through the display section 180 and operation section 190.

FIGS. 2A–2E show an example of pulse sequences used for imaging by this apparatus. These pulse sequences are of the gradient (GRE) scheme.

Specifically shown by RF is the sequence of $\alpha°$ pulses for RF excitation of the GRE schemer and shown by GS, GR, GP and MR are the sequences of slice gradient Gs, read-out gradient Gr and phase encode gradient Gp, and the gradient echo MR. The $\alpha°$ pulse is represented by the center signal. The pulse sequences progress from left to right along the time axis t.

The $\alpha°$ pulse is used to implement the $\alpha°$ excitation of spin as shown in the figure. The flip angle $\alpha°$ is 90° or less. At this time point, the slice gradient Gs is applied to implement the selective excitation for a certain slice.

The $\alpha°$ excitation is followed by phase encoding of the spin by the phase encode gradient Gp. Subsequently, the spin is dephased by the read-out gradient Gr, and next it is rephased to generate a gradient echo MR. The gradient echo MR has a peak of signal level on expiration of an echo time TE after the $\alpha°$ excitation. The gradient echo MR is collected as view data by the data collecting section 150.

These pulse sequences are repeated 64–512 times at an interval of repetition time (TR). At each event of pulse sequence, the phase encode gradient Gp is altered to implement different phase encoding. Finally, data of 64–512 views which fill the k-space is obtained.

FIGS. 3A–3E show another example of pulse sequences for magnetic resonance imaging. These pulse sequences are of the spin echo (SE) scheme.

Specifically shown by RF are the sequences of 90° pulse and 180° pulse for RF excitation of the SE scheme, and shown by GS, GR, GP and RF are the sequences of slice gradient Gs, read-out gradient Gr and phase encode gradient Gp, and the spin echo MR. The 90° pulse and 180° pulse are represented by the center signals. The pulse sequences progress from left to right along the time axis t.

The 90° pulse is used to implement the 90° excitation of the spin as shown in the figure. At this time, selective excitation takes place for a certain slice, with the slice gradient Gs being applied thereto. On expiration of a certain time length following the 90° excitation, the 180° excitation by the 180° pulse, i.e., spin inversion, takes place. The same slice undergoes the selective inversion with the application of the slice gradient Gs.

During the period of the 90° excitation and spin inversion, the read-out gradient Gr and phase encode gradient Gp are applied. The spin is dephased by the read-out gradient Gr. Phase encoding of the spin by the phase encode gradient Gp takes place.

Following the spin inversion, the spin is rephased by the read-out gradient Gr to generate a spin echo MR. The spin echo MR has a peak of signal level on expiration of TE after the 90° excitation. The spin echo MR is collected as view data by the data collecting section 150. These pulse sequences are repeated 64–512 times. At each event of pulse sequence, the phase encode gradient Gp is altered to implement different phase encoding. Finally, data of 64–512 view which fill the k-space is obtained.

The pulse sequences used for imaging are not confined to be of the GRE scheme or SE scheme, but can otherwise be of the fast spin echo (FSE) scheme, fast recovery fast spin echo (FSE) scheme, or echo planar imaging (EPI) scheme, for example.

The data processing section 170 implements the inverse 2-degree Fourier transformation for the view data of the k-space, thereby recomposing a tomographic image of the subject 300. Since the static magnetic field is rid of the adverse influence of the d.c. bias which disables the sending coil section 108, a high quality tomographic image is produced. The recomposed image is stored in the memory and also displayed on the display section 180.

FIG. 4 shows schematically the cross-sectional structure of the portion of the magnet system 100 in the neighborhood of the sending coil section 108. In the figure, letter o indicates the center of magnetic field, i.e., magnet center, and letters x, y and z indicate the three directions mentioned previously.

A spheric volume SV having a center at the magnet center "o" and radius R defines an imaging region, and the magnet system 100 is designed so that the static magnetic field, gradient magnetic field and RF magnetic field are accurate as prescribed within the region SV.

The main-field magnet section 102 in pairs has a pair of magnetic pole pieces 202 which confront each other. The pole pieces 202 are made of a magnetic material, such as soft iron, having a high permeability, and function to make a uniform flux distribution in the space of static magnetic field.

The pole pieces 202, which have a generally disc-like shape, have their rim sections protruding in the direction normal to the disc surface (i.e., z direction) so as to face each other. Accordingly, each pole piece 202 has a base section and a protruding rim section. The rim sections function to regain the magnetic flux density that falls at the rim of the pole pieces 202.

Each pole piece 202 has a recessed section formed inside the rim section, in which are fitted the gradient coil section 106 and sending coil section 108. Both coil sections having a generally disc-like shape are laid by being laminated on the surface of the pole piece 202 by a proper fixing means (not shown).

Figure 5:
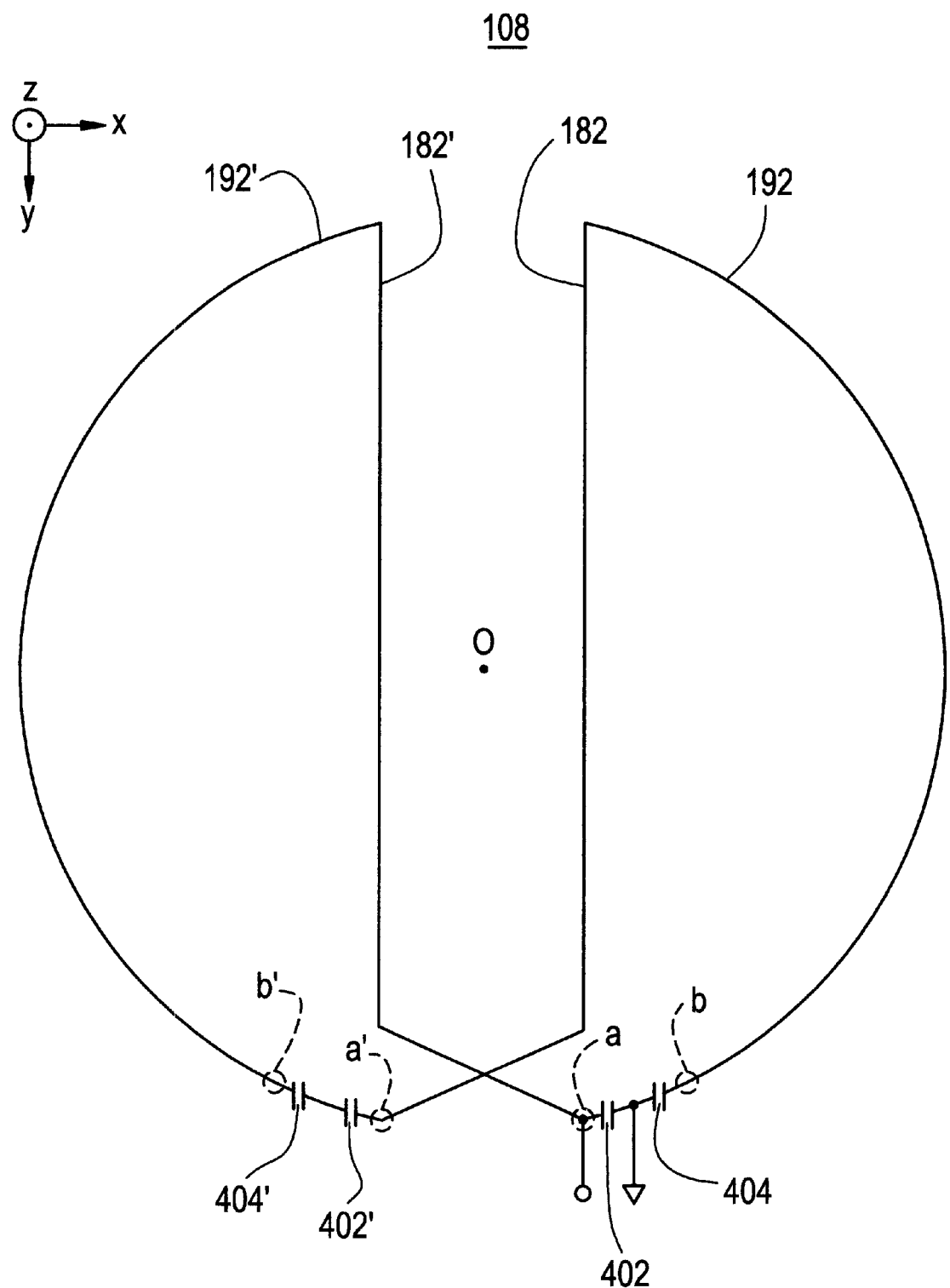
FIG. 5 is a schematic diagram showing a pattern of current paths of the sending coil section shown in FIG. 4.

FIG. 5 shows schematically a basic pattern of current paths of the RF coil which takes up the major portion of the sending coil section 108. The sending coil section 108 has, in its portion close to the center "o", two linear main current paths (main passes) 182 and 182' running in parallel to the y direction. These main passes 182 and 182' have a mirror-image relation with each other on the xy plane with respect to the y axis which passes through the center "o". The main passes 182 and 182' are an example of embodiment of the inventive main current paths.

Return passes 192 and 192' lie round beside the main passes 182 and 182', respectively. The return passes 192 and 192' are an example of embodiment of the inventive round-about current paths.

The return pass 192 connects the main passes 182 and 182' in series so that they have a same current direction, while the return pass 192' connects the main passes 182' and 182 in series so that they have the same current direction.

The return pass 192 is connected at its end joining to the main pass 182' with capacitors 402 and 404 in series, while the return pass 192' is connected at its end joining to the main pass 182 with capacitors 402' and 404' in series, so that these capacitors in unison with the main passes 182 and 182' and return passes 192 and 192' form an LC circuit. The LC circuit has its resonance frequency tuned to the magnetic resonance frequency. The capacitors 402 and 404 have their node grounded, and an RF drive signal which is produced against the ground is fed to the capacitor 402 from the RF drive section 140.

As a variant arrangement, one or more tuning capacitors may be connected in series at proper points on the main passes 182 and 182' and return passes 192 and 192' in addition to the capacitors 402 through 404'.

On this RF coil, the left terminal "a" of the capacitor 402 and the right terminal "a'" of the capacitor 402' on the drawing have an equal RF potential. Similarly, the right terminal "b" of the capacitor 404 and the left terminal "b'" of the capacitor 404' have an equal RF potential. The points "a" and "a'" and the points "b" and "b'" have opposite polarities of potential.

Figure 6:
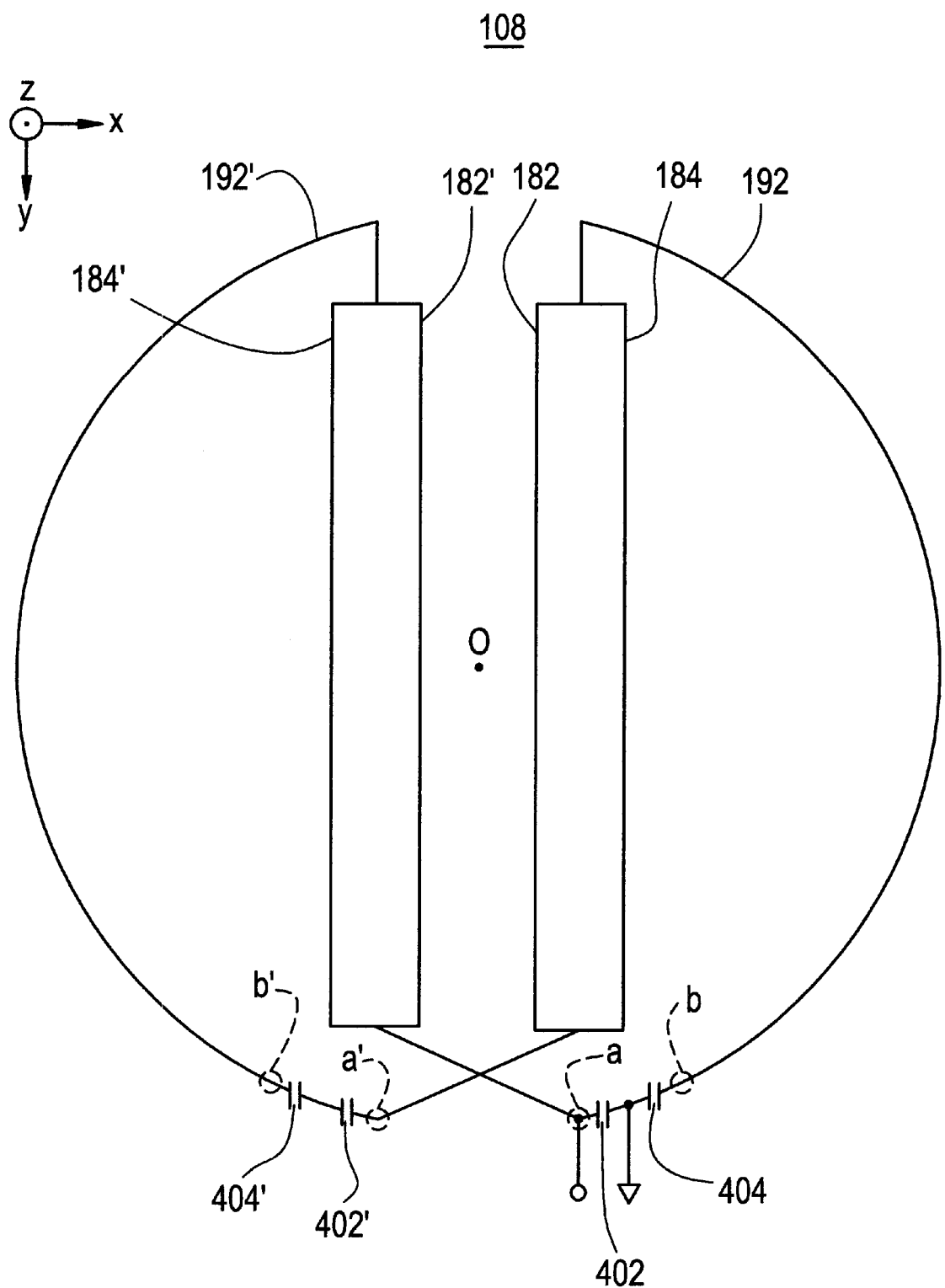
FIG. 6 is a schematic diagram showing a pattern of current paths of the sending coil section shown in FIG. 4.
Figure 7:
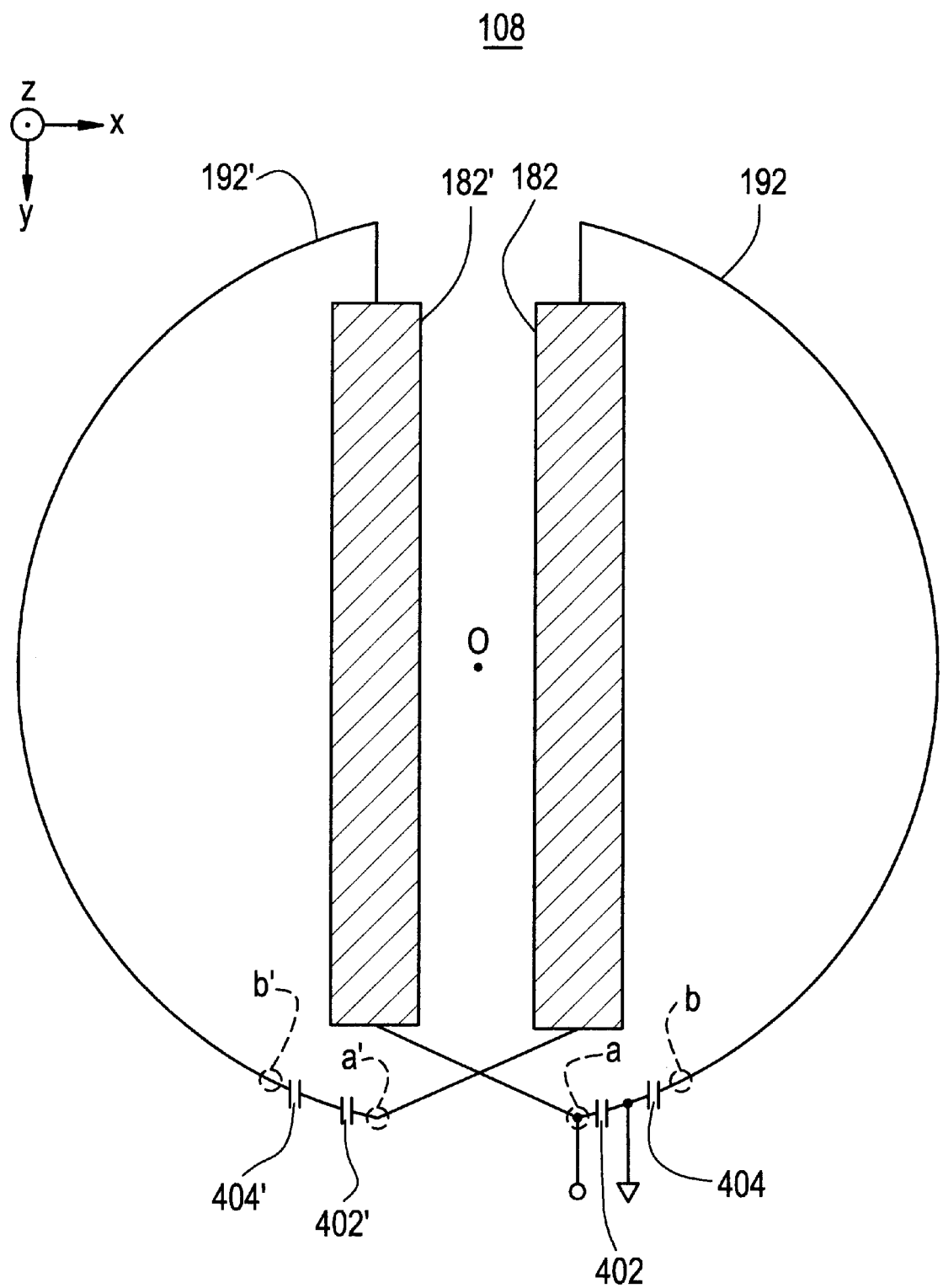
FIG. 7 is a schematic diagram showing a pattern of current paths of the sending coil section shown in FIG. 4.

The above-mentioned affair is invariable for a variant arrangement shown in FIG. 6 where the main passes 182 and 182' are each formed in two lines, and for another variant arrangement shown in FIG. 7 where the main passes 182 and 182' are formed of sheet conductors. The main passes 182 and 182' of the paired lines or sheet conductors contribute to making a uniform RF magnetic field distribution.

Figure 8:
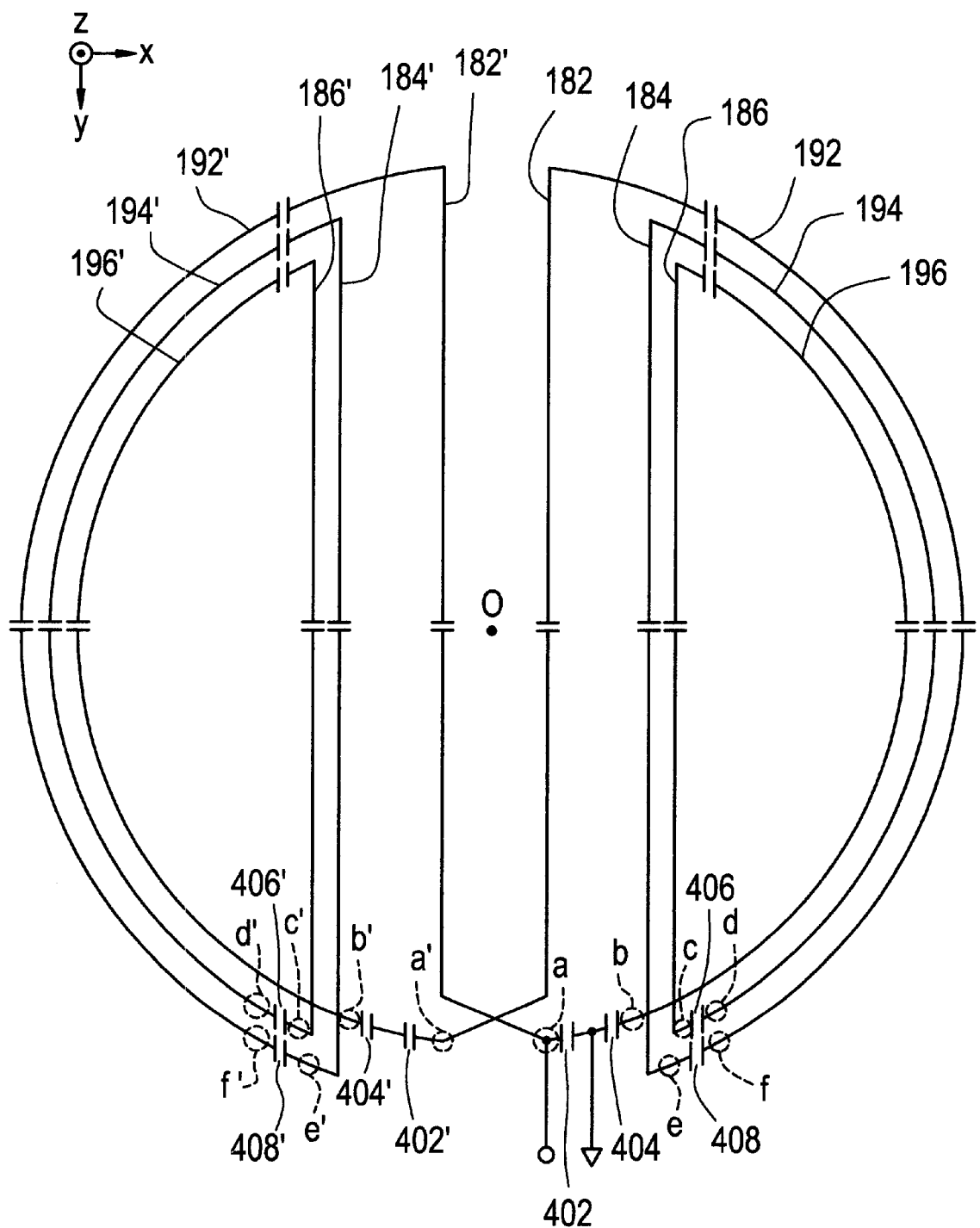
FIG. 8 is a schematic diagram showing a pattern of current paths of the sending coil section shown in FIG. 4.

FIG. 8 shows, for example, a pattern of RF coil which enables a uniform distribution or arbitrary distribution of the RF magnetic field. In this example, the sending coil section 108 includes, in its portion close to the center "o", a number of linear main passes 182, 184, 186, 182', 184' and 186' which are parallel to the y direction. The main passes 182, 184 and 186 are progressively more distant in this order from the center "o", which affair is common to the main passes 182', 184' and 186'.

The main passes 182, 184 and 186 are an example of embodiment of the inventive first current paths, while the main passes 182', 184' and 186' are an example of embodiment of the inventive second current paths.

The main passes 182, 184 and 186 and the main passes 182', 184' and 186' have a mirror-image relation with each other on the xy plane with respect to the y axis which passes through the center "o". The number of main passes is arbitrary, instead of six in this example.

Return passes 192, 194, 196, 192', 194' and 196' lie round beside the main passes. The return passes 192, 194, 196, 192', 194' and 196' are an example of embodiment of the inventive third current paths.

The return pass 192 connects the main passes 182 and 184 in series so that they have a same current direction, the return pass 194 connects the main passes 184 and 186 in series so that they have the same current direction, and the return pass 196 connects the main passes 186 and 182' in series so that they have the same current direction.

The return pass 192' connects the main passes 182' and 184' in series to so that they have the same current direction, the return pass 194' connects the main passes 184' and 186' in series so that they have the same current direction, and the return pass 196' connects the main passes 186' and 182 in series so that they have the same current direction.

The return pass 196 is connected at its end joining to the main pass 182' with capacitors 402 and 404 in series, and the return pass 196' is connected at its end joining to the main pass 182 with capacitors 402' and 404' in series.

The return pass 194 is connected at its end joining to the main pass 186 with a capacitor 406 in series, and the return pass 194' is connected at its end joining to the main pass 186' with a capacitor 406' in series.

The return pass 192 is connected at its end joining to the main pass 184 with a capacitor 408 in series, and the return pass 192' is connected at its end joining to the main pass 184' with a capacitor 408' in series.

More capacitors are inserted in series at proper points on the main passes 182 through 186' and return passes 192 through 196'. All of these capacitors in unison with the main passes 182 and return passes 192 through 196' form an LC circuit. The LC circuit has its resonance frequency tuned to the magnetic resonance frequency.

The capacitors 402 and 404 have their node grounded, and an RF drive signal which is produced against the ground is fed to the capacitor 402 from the RF drive section 140.

The main passes 182, 184, 186, 182', 184' and 186' are connected in series by the return passes 192, 194, 196, 192', 194' and 196' to have the same current direction. Consequently, all currents flowing through the main passes 182, 184, 186, 182', 184' and 186' have an equal value.

The RF magnetic field has its distribution in the imaging space determined from the layout of the main passes 182 through 186' on the xy plane. The layout of the main passes 182 through 186' for establishing a uniform distribution or an intended distribution of the RF magnetic field can be determined by calculation.

On this RF coil, the left terminal "a" of the capacitor 402 and the right terminal "a'" of the capacitor 402' have an equal RF potential, and the right terminal "b" of the capacitor 404 and the left terminal "b'" of the capacitor 404' have an equal RF potential. The points "a" and "a'" and the points "b" and "b'" have opposite polarities of potential.

The left terminal "c" of the capacitor 406 and the right terminal "c'" of the capacitor 406' have an equal RF potential, and the right terminal "d" of the capacitor 406 and the left terminal "d'" of the capacitor 406' have an equal RF potential. The points "c" and "c'" and the points "d" and "d'" have opposite polarities of potential.

The left terminal "e" of the capacitor 408 and the right terminal "e'" of the capacitor 408' have an equal RF potential, and the right terminal "f" of the capacitor 408 and the left terminal "f'" of the capacitor 408' have an equal RF potential. The points "e" and "e'" and the points "f" and "f'" have opposite polarities of potential.

The points a, c, e, a', c' and e' have an equal RF potential, the points b, d, f, b', d' and f' have an equal RF potential, and the points a, c, e, a', c' and e' and the points b, d, f, b', d' and f' have opposite polarities of potential.

On this RF coil, the RF current flowing through each pass is not affected by the interconnection of the RF equipotential points through RF choke circuits.

Based on this property, a d.c. bias feed path for the disable circuits, which will be explained shortly, is formed by means of RF choke circuits which interconnect the RF equipotential points (will be termed simply "equipotential points").

Figure 9:
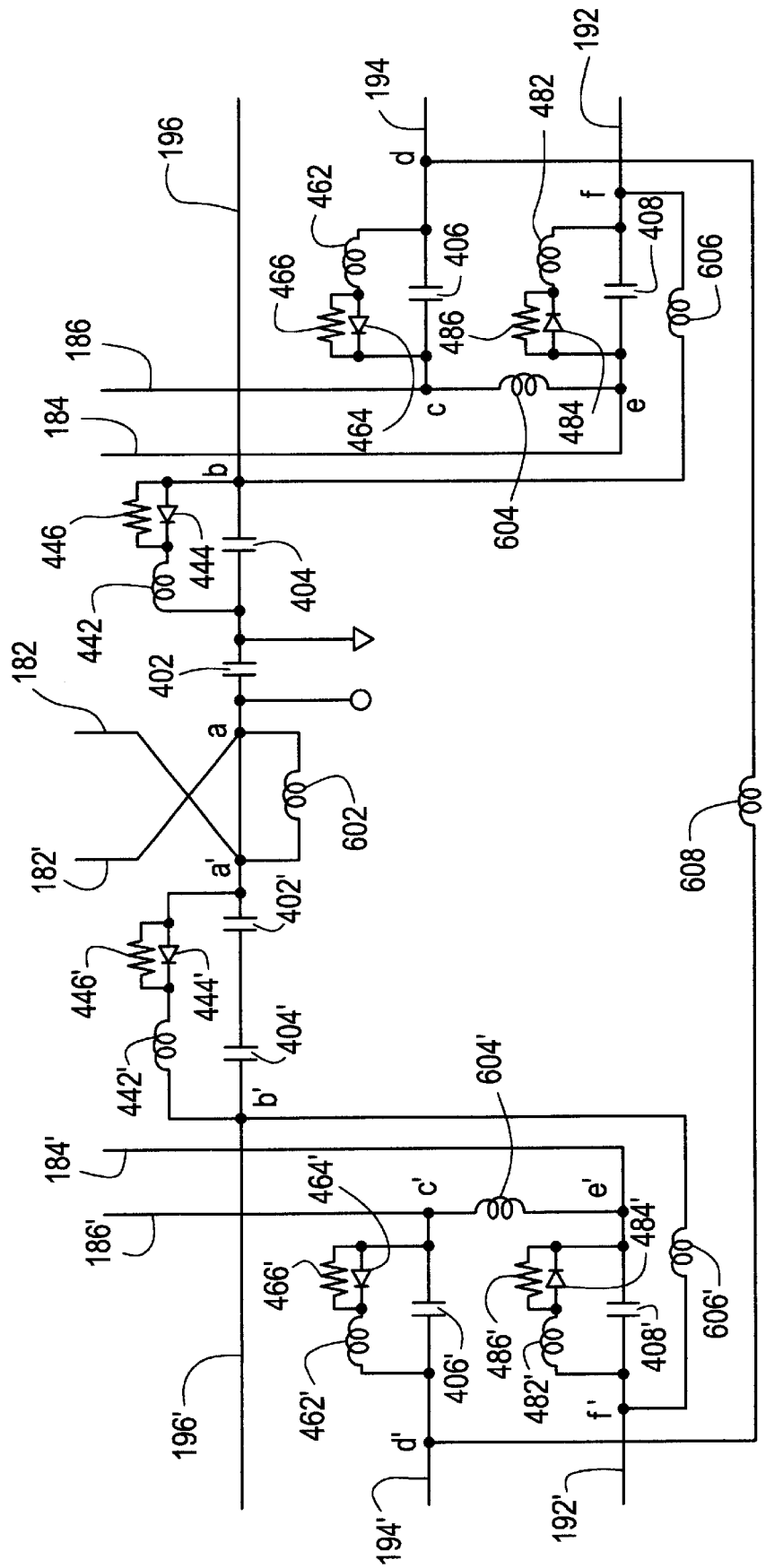
FIG. 9 is a circuit diagram of the portion of disable circuits of the sending coil section shown in FIG. 8.

FIG. 9 shows an example of the arrangement of the disable circuits. The figure is a schematic circuit diagram of the disable circuits fitted to the RF coil shown in FIG. 8. The disable circuits are part of the RF coil shown in FIG. 8.

As shown in the figure, a capacitor 404 is connected in parallel with a serial circuit of an inductor 442 and a diode 444. A resistor 446 is connected in parallel to the diode 444. The resistor 446 is a high-resistance resistor.

The circuit formed of the capacitor 404, inductor 442, diode 444 and resistor 446 constitutes a disable circuit. This disable circuit is an example of embodiment of the inventive disable circuit.

With the diode 444 being in the on state, an LC circuit is formed by the capacitor 404 and inductor 442. The LC circuit has its resonance frequency tuned to the frequency of the magnetic resonance signal, and it enters the high impedance state attributable to its parallel resonation, thereby performing the disable function. With the diode being in the reverse bias state, the parallel connection of the capacitor 404 and inductor 442 dissolves, and the disable function is not brought into action.

Similar disable circuits are formed of a capacitor 406 connected in parallel to a serial circuit of an inductor 462 and a diode 464, a capacitor 408 connected in parallel to a serial circuit of an inductor 482 and a diode 484, a capacitor 406' connected in parallel to a serial circuit of an inductor 462' and a diode 464', and a capacitor 408' connected in parallel to a serial circuit of an inductor 482' and a diode 484'. A high-resistance resistor is connected in parallel to each diode.

The equipotential points a and α are connected by an RF choke circuit 602. The equipotential points c and e are connected by an RF choke circuit 604. The equipotential points b and f are connected by an RF choke circuit 606. The equipotential points c' and e' are connected by an RF choke circuit 604'. The equipotential points b' and f' are connected by an RF choke circuit 606'. The equipotential points d and d' are connected by an RF choke circuit 608.

The RF choke circuits 602, 604, 604', 606, 606' and 608 are an example of embodiment of the inventive RF choke circuits. The RF choke circuits 602, 604, 604', 606, 606' and 608 are each formed of an inductor which has large impedance values in the RF domain and small resistance values in the d.c. domain, for example.

Figure 10:
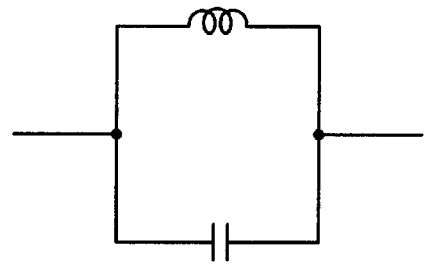
FIG. 10 is a circuit diagram of an RF choke circuit.
Figure 11:
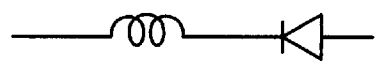
FIG. 11 is a circuit diagram of an RF choke circuit.

However, the RF choke circuit is not confined to this arrangement, but it may be, for example, an L-C parallel circuit tuned to the magnetic resonance signal as shown in FIG. 10, or an inductor having large impedance values in the RF domain connected in series with a diode as shown in FIG. 11. All of these RF choke circuits have large impedance values in the RF domain and small resistance values in the d.c. domain.

Based on the interconnection of the equipotential points on the return passes by the RF choke circuits 602, 604, 604', 606, 606' and 608, there is formed a current path starting at the left terminal of the capacitor 402, passing sequentially through the RF choke circuit 602, diode 444', inductor 442', RF choke circuit 606', inductor 482', diode 484', RF choke circuit 604', diode 464', inductor 462', RF choke circuit 608, inductor 462, diode 464, RF choke circuit 604, diode 484, inductor 482, RF choke circuit 606, diode 444, inductor 442, and ending at the right terminal of the capacitor 402.

This current path has no current flow due to the presence of the RF choke circuits 602, 604, 604', 606, 606' and 608 which connect the equipotential points of the path.

All diodes on the current path lie in the same direction in terms of the polarity. Accordingly, supplying a d.c. forward bias current to the diodes through the current path forms L-C parallel circuits in the disable circuits, thereby effectuating their disable function. Conversely, applying a d.c. reverse bias voltage to the current path deactivates the disable circuits. Each diode has a parallel connection of a high-resistance resistor, which stabilizes the reverse bias voltage of the diode.

Figure 12:
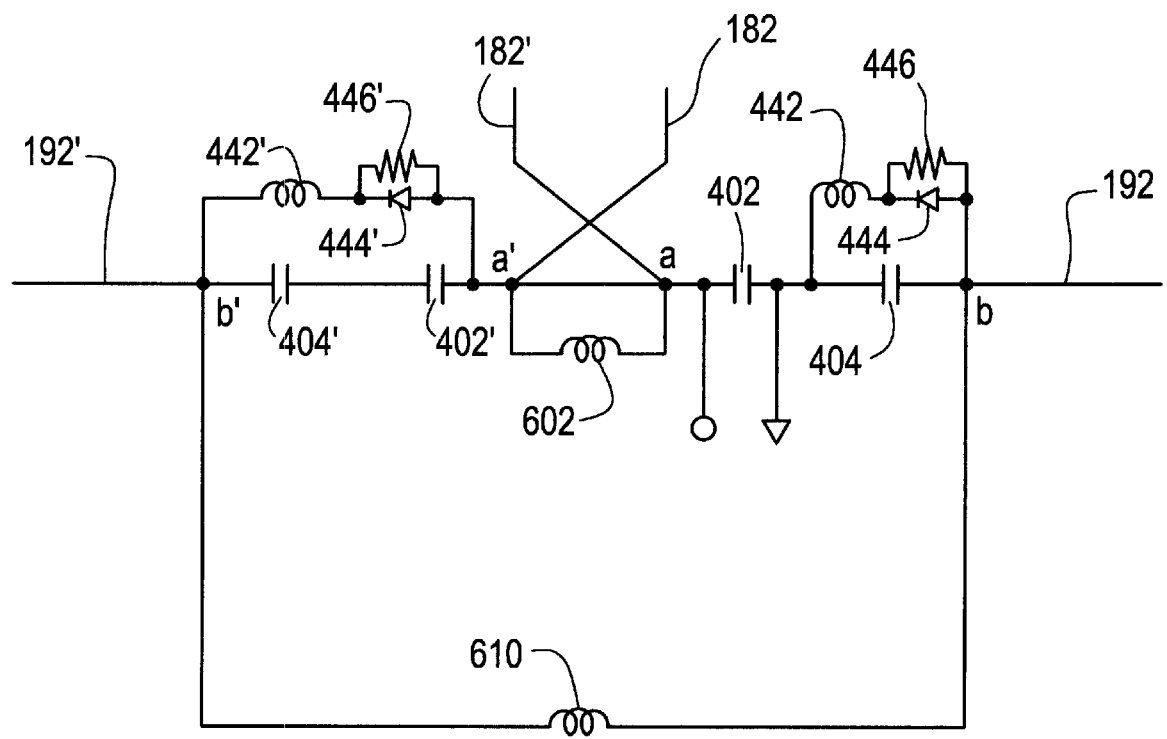
FIG. 12 is a circuit diagram of the portion of disable circuits of the sending coil sections shown in FIG. 5 through FIG. 7.

In the cases of the RF coils having the coil patterns shown in FIG. 5, FIG. 6 and FIG. 7, disable circuits and associated bias signal feed circuit are formed in the same fashion as described above. These circuits are as shown in FIG. 12 for example. The RF coils shown in FIG. 5, FIG. 6 and FIG. 7 have a smaller number of disable circuits and RF choke circuits due to a smaller number of return passes as compared with that shown in FIG. 8.

For these circuit arrangements, the bias signal for activating and deactivating the disable circuits can be applied to the terminals of the capacitor 402, i.e., the same points as to supply the RF drive signal. Accordingly, both the RF drive signal and bias signal can be supplied through common signal lines, instead of needing independent bias signal feed lines.

The d.c. bias signal is conducted only through very small parts of the return pass and is not conducted through the main passes, and consequently a d.c. magnetic field created by the bias signal does not adversely affect the static magnetic field of the imaging space.

Figure 13:
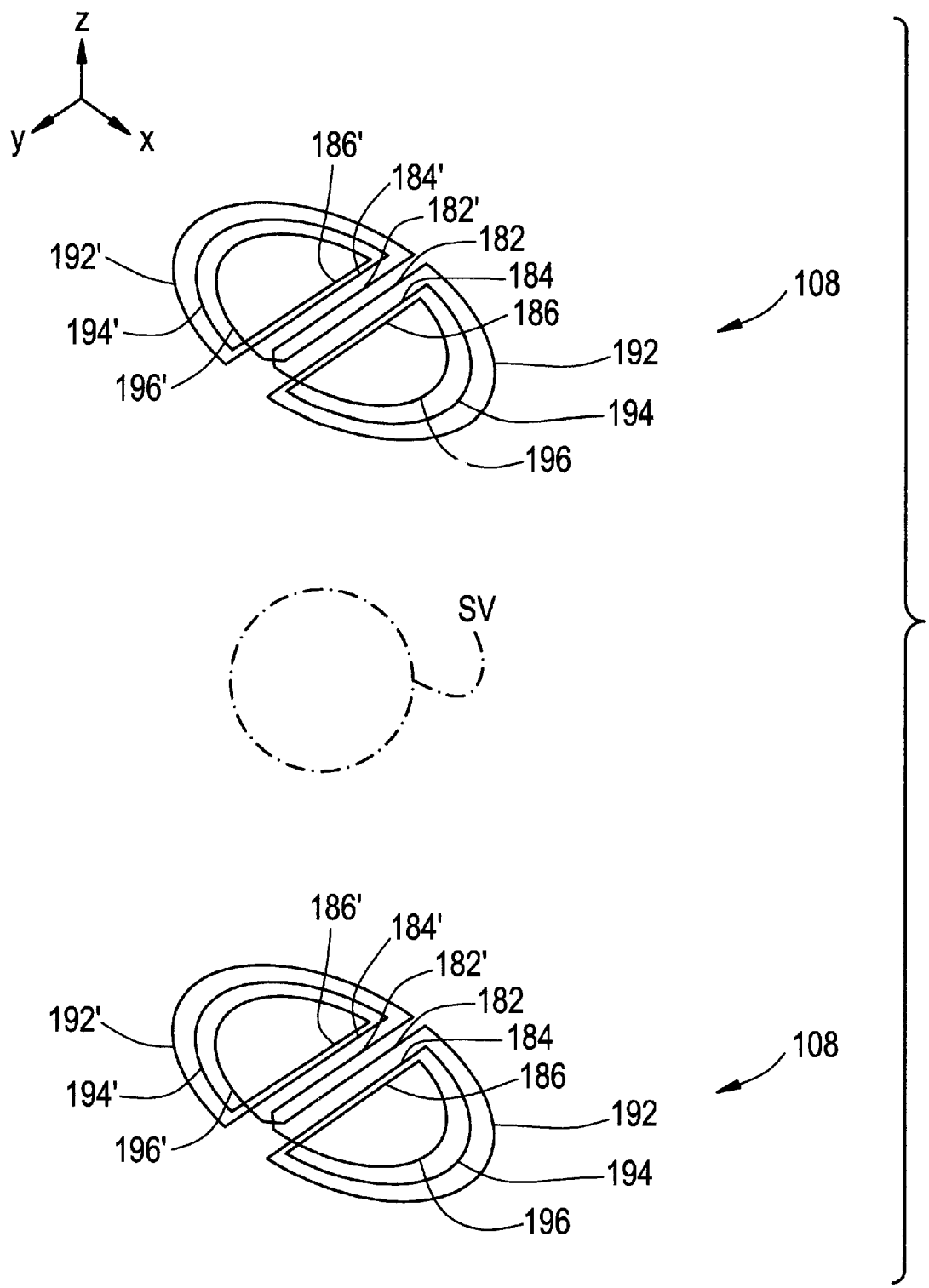
FIG. 13 is a schematic diagram showing patterns of current paths of the sending coil section shown in FIG. 4.

A pair of sending coil sections 108 having the patterned coils, disable circuits and RF choke circuits are disposed to confront each other on both sides of the imaging space SV as shown in FIG. 13. The figure shows only the coil pattern expediently, which affair is common to the following figures.

The sending coil sections 108 in pairs are supplied with drive signals of opposite polarities, and the sum of RF magnetic fields produced by the sending coil sections 108 is applied to the imaging space SV. The RF magnetic field induces a spin in the subject 300. In case a summed RF magnetic field is not necessary, one of the pair of sending coil sections 108 may be omitted.

The main passes 182, 184 and 186 of one of the pair of sending coil sections 108 are an example of embodiment of the inventive first current paths, the main passes 182', 184' and 186' are an example of embodiment of the inventive second current paths, and the return passes 192, 194, 196, 192', 194' and 196' are an example of embodiment of the inventive third current paths.

The main passes 182, 184 and 186 of another of the pair of sending coil sections 108 are an example of embodiment of the inventive fourth current paths, the main passes 182', 184' and 186' are an example of embodiment of the inventive fifth current paths, and the return passes 192, 194, 196, 192', 194' and 196' are an example of embodiment of the inventive sixth current paths.

Figure 14:
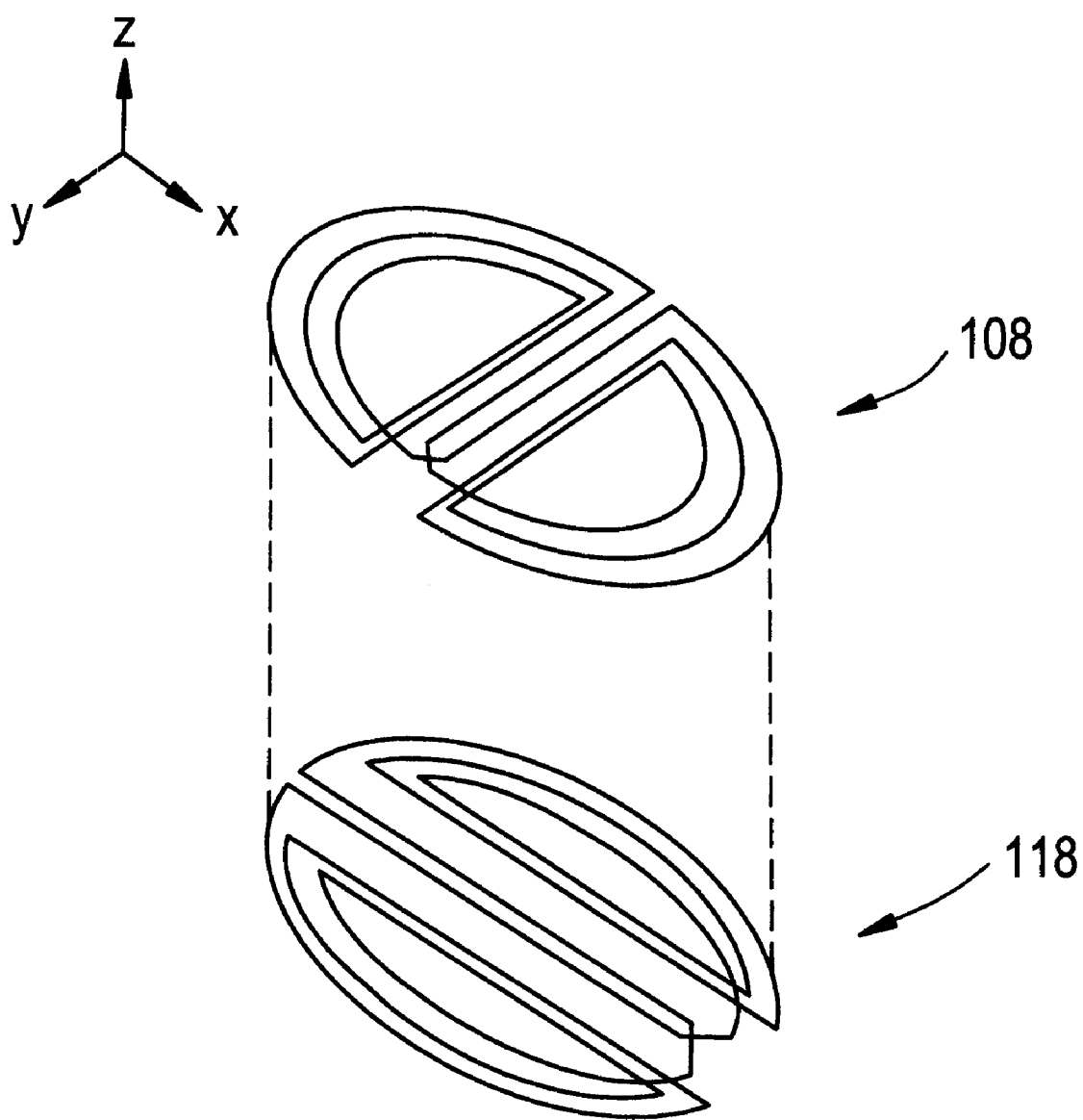
FIG. 14 is a schematic diagram showing patterns of current paths of the sending coil section shown in FIG. 4.

The sending coil section 108 may be accompanied face-to-face by another sending coil section 118 having its coil pattern rotated by 90° on the xy plane as shown in FIG. 14 for example, with both coil sections being insulates from each other obviously.

Figure 15:
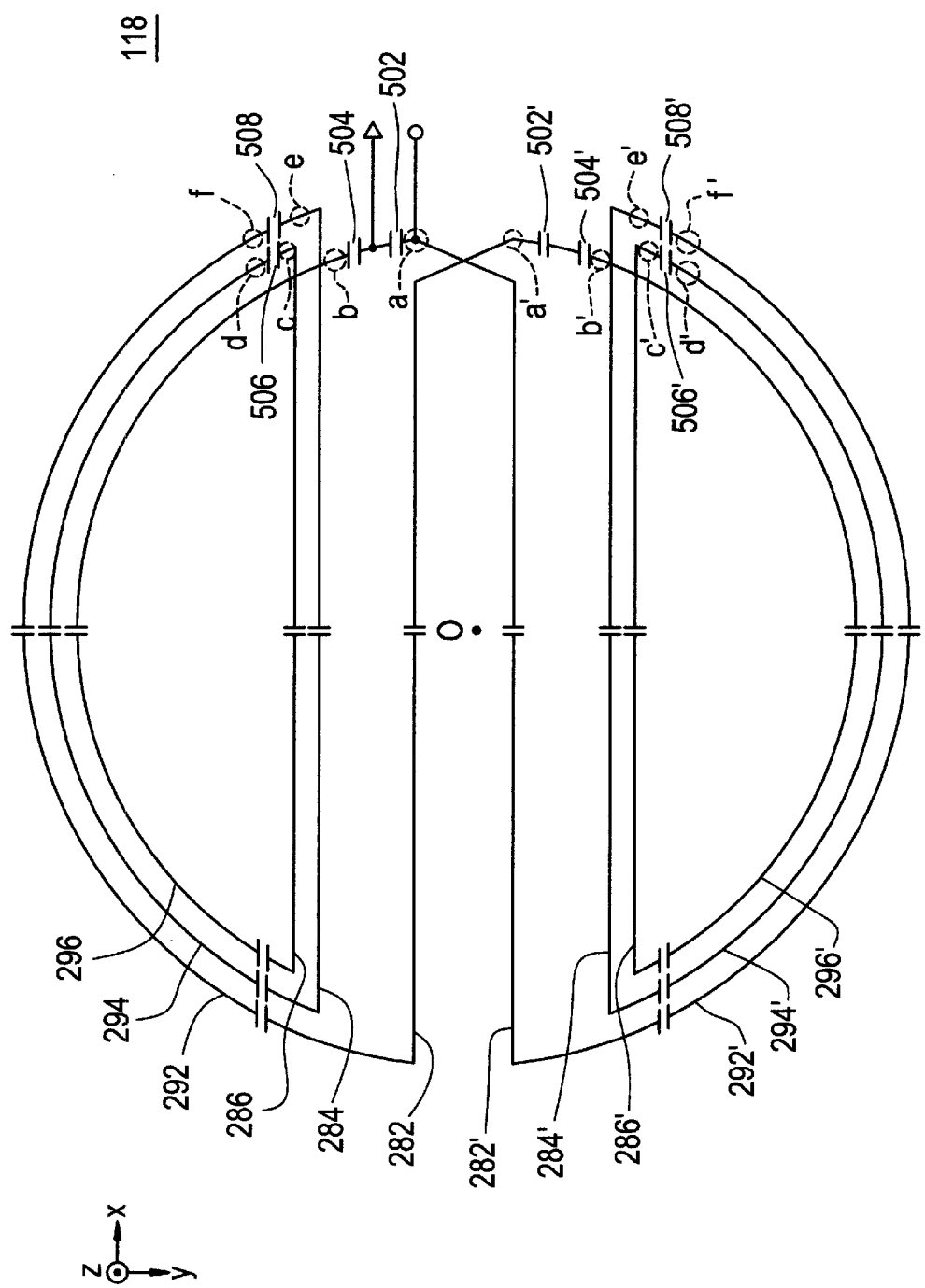
FIG. 15 is a schematic diagram showing a pattern of current paths of the sending coil section shown in FIG. 4.

FIG. 15 shows a coil pattern of the sending coil section 118. As shown in the figure, the sending coil section 118 is derived with 90° rotation from the coil pattern shown in FIG. 8.

More specifically, the sending coil section 118 includes, in its portion close to the center "o", linear main passes 282, 284, 286, 282', 284' and 286' which are parallel to the x direction. The main passes 282, 284 and 286 are progressively more distant in this order from the center "o", which affair is common to the main passes 282', 284' and 286'.

The main passes 282, 284 and 286 are an example of embodiment of the inventive seventh current paths. The main passes 282', 284' and 286' are an example of embodiment of the inventive eighth current paths.

Return passes 292, 294, 296, 292', 294' and 296' lie round beside the main passes. The return passes 292, 294, 296, 292', 294' and 296' are an example of embodiment of the inventive ninth current paths.

The return pass 292 connects the main passes 282 and 284 in series so that they have a same current direction, the return pass 294 connects the main passes 284 and 286 in series so that they have the same current direction, and the return pass 296 connects the main passes 286 and 282' in series so that they have the same current direction.

The return pass 292' connects the main passes 282' and 284' in series to so that they have the same current direction, the return pass 294' connects the main passes 284' and 286' in series so that they have the same current direction, and the return pass 296' connects the main passes 286' and 282 in series so that they have the same current direction.

The return pass 296 is connected at its end joining to the main pass 282' with capacitors 502 and 504 in series, the return pass 296' is connected at its end joining to the main pass 282 with capacitors 502' and 504' in series.

The return pass 294 is connected at its end joining to the main pass 286 with a capacitor 506 in series, the return pass 294' is connected at its end joining to the main pass 286' with a capacitor 506' in series.

The return pass 292 is connected at its end joining to the main pass 284 with a capacitor 508 in series, the return pass 292' is connected at its end joining to the main pass 284' with a capacitor 508' in series.

More capacitors are inserted in series at proper points on the main passes 282 through 286' and return passes 292 through 296'. All of these capacitors in unison with the main passes 282 through 286' and return passes 292 through 296' form an LC circuit. The LC circuit has its resonance frequency tuned to the magnetic resonance frequency.

The capacitors 502 and 504 have their node grounded, and an RF drive signal which is produced against the ground is fed to the capacitor 502 from the RF drive section 140.

The main passes 282, 284, 286, 282', 284' and 286' are connected in series by the return passes 292, 294, 296, 292', 294' and 296' to have the same current direction. Consequently, all currents flowing through the main passes 282, 284, 286, 282', 284' and 286' have an equal value.

The RF magnetic field has its distribution in the imaging space determined from the layout of the main passes 282 through 286' on the xy plane. The layout of the main passes 282 through 286' for establishing a uniform distribution or an intended distribution of the RF magnetic field can be determined by calculation.

Also on this RF coil, the lower terminal "a" of the capacitor 502 and the upper terminal "a'" of the capacitor 502' have an equal RF potential, and the upper terminal "b" of the capacitor 504 and the lower terminal "b'" of the capacitor 504' have an equal RF potential. The points "a" and "a'" and the points "b" and "b'" have opposite polarities of potential.

The lower terminal "c" of the capacitor 506 and the upper terminal "c'" of the capacitor 506' have an equal RF potential, and the upper terminal "d" of the capacitor 506 and the lower terminal "d'" of the capacitor 506' have an equal RF potential. The points "c" and "c'" and the points "d" and "d'" have opposite polarities of potential.

The lower terminal "e" of the capacitor 508 and the upper terminal "e'" of the capacitor 508' have an equal RF potential, and the upper terminal "f" of the capacitor 508 and the lower terminal "f'" of the capacitor 508' have an equal RF potential. The points "e" and "e'" and the points "f" and "f'" have opposite polarities of potential.

The points a, c, e, a', c' and e' have an equal RF potential, the points b, d, f, b', d' and f' have an equal RF potential, and the points a, c, e, a', c' and e' and the points b, d, f, b', d' and f' have opposite polarities of potential.

Also on this RF coil 118, disable circuits and associated bias signal feed circuit are formed in the same fashion as the RF coil 108. The bias signal feed circuits may be formed through the sending coil sections 108 and 118 in series.

Figure 16:
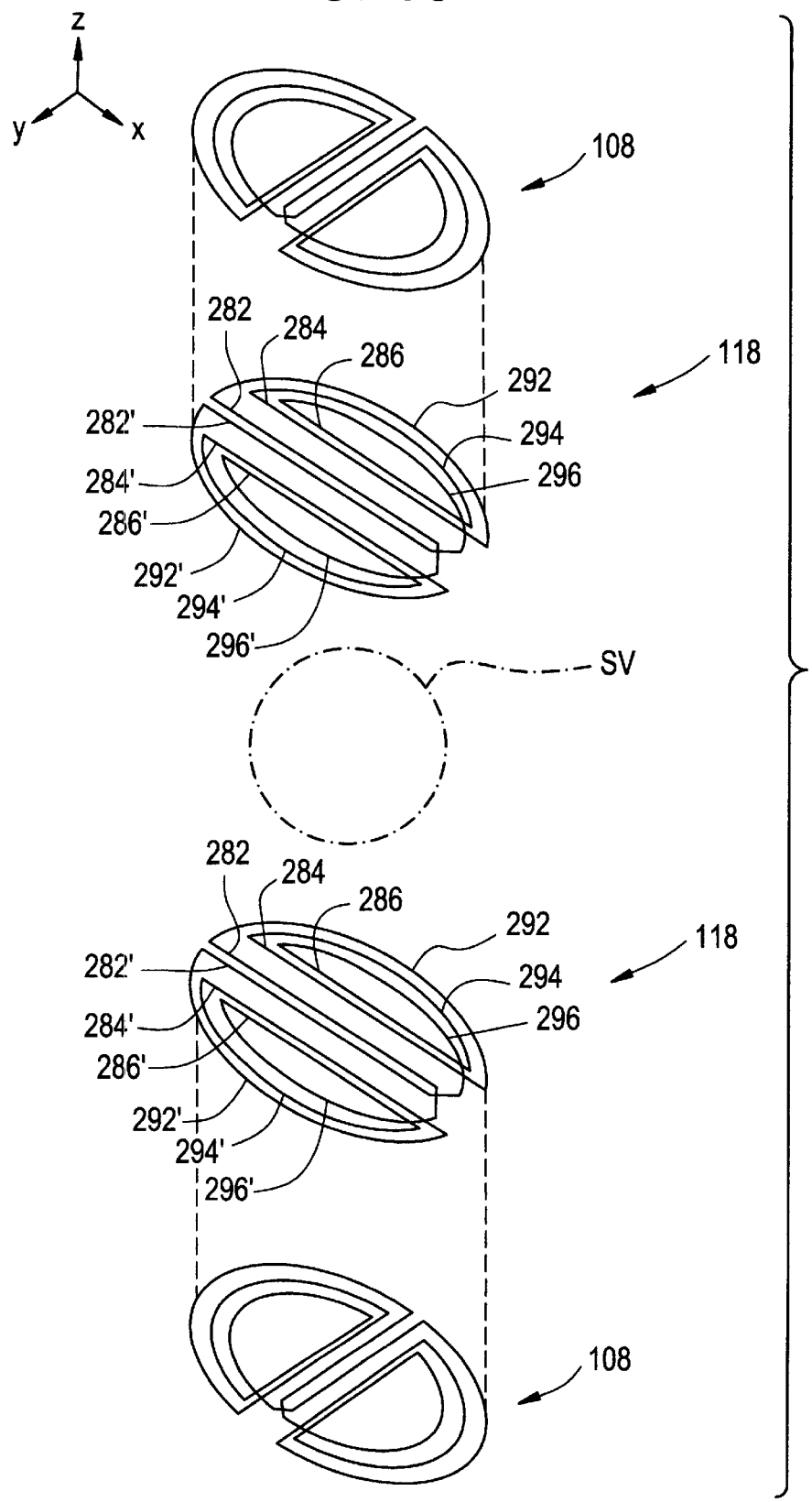
FIG. 16 is a schematic diagram showing patterns of current paths of the sending coil section shown in FIG. 4.

A pair of sending coil sections 118 having the patterned coils, disable circuits and RF choke circuits are disposed to confront each other together with the pair of sending coil sections 108 on both sides of the imaging space SV as shown in FIG. 16 for example. The sending coil sections 118 in pairs are supplied with drive signals of opposite polarities, and the sum of RF magnetic fields produced by the sending coil sections 118 is applied to the imaging space SV. The RF magnetic field induces a spin in the subject 300. In case a summed RF magnetic field is not necessary, one of the pair of sending coil sections 118 may be omitted.

The main passes 282, 284 and 286 of one of the pair of sending coil sections 118 are an example of embodiment of the inventive seventh current paths, the main passes 282', 284' and 286' are an example of embodiment of the inventive eighth current paths, and the return passes 292, 294, 296, 292', 294' and 296' are an example of embodiment of the inventive ninth current paths.

The main passes 282, 284 and 286 of another of the pair of sending coil sections 118 are an example of embodiment of the inventive tenth current paths, the main passes 282', 284' and 286' are an example of embodiment of the inventive eleventh current paths, and the return passes 292, 294, 296, 292', 294' and 296' are an example of embodiment of the inventive twelfth current paths.

The sending coil sections 108 and 118 have their drive signals made opposite in phase by 90° thereby performing the so-called quadrature operation to produce an RF magnetic field which revolves on the xy plane within the imaging space SV. The RF magnetic field induces a spin in the subject 300.

Although examples of the sending RF coil have been explained, another RF coil of the exactly same structure can be used for the reception of magnetic resonance signal. Magnetic resonance signals are led out of both terminals of the capacitors 402 and 502.

Many widely different embodiments of the present invention may be configured without departing from the spirit and the scope of the present invention. It should be understood that the present invention is not limited to the specific embodiments described in the specification, except as defined in the appended claims.

What is claimed is:

1. One or more MRI RF coil sets with each RF coil set comprising:

a plurality of disable circuits each having a capacitor connected in parallel to a circuit containing an inductor connected serially to a diode;

a plurality of first main pass extended conductors arranged in generally the same plane and in parallel to each other and each different first extended conductor having a first end and a second end;

an RF choke disposed between said first ends of said first extended conductors; and a plurality of second return pass semi-circular conductors arranged to have their ends connected to each first and second ends of said first extended conductors and be generally in the same plane as the plurality of first extended conductor;

wherein one of said plurality of disable circuits is disposed connected to a location where one of said plurality of second semi-circular conductors is connected to said first end of one of said first extended conductors and another of said plurality of disable circuits is disposed connected to a different location where another of said plurality of second semi-circular conductors is connected to a different said first end of another of said plurality or first extended conductors.

2. The RF coil of claim 1, wherein said plurality of first extended conductors each comprises a pair of parallel conductors.

3. The RF coil of claim 1, wherein said plurality of first extended conductors each comprises a planar conductor.

4. The RE coil of claim 1, wherein said plurality of second semi-circular conductors are generally semi-circular in shape with a straight conductor connecting the ends thereof.

5. The RF coil of claim 1, wherein said plurality of disable circuits are six in number with three disposed on each side of said RF choke.

6. The RF coil of claim 1, further comprising two coil sets disposed to be generally in planes parallel to each other.

7. The RF coil of claim 6, wherein said two coils sets are arranged so that the parallel first extended conductors of each set are positioned to be perpendicular to each other.

8. The RF coil of claim 1, wherein further comprising four coil sets (A,B,C,D) disposed to be generally in plane parallel to each other, with one pair (A,B) of the four sets of coils (A,B, C,D) having the first parallely extended conductors of one set (A) positioned to be perpendicular to the first parallely extended conductors of another set (B), and with another pair (C,D) of the four sets of coils (A,B,C,D) having first parallely extended conductors of one set (C) positioned to be perpendicular to the first parallely extended conductors of another set (D).

9. A magnetic resonance imaging apparatus for forming an image based on a magnetic resonance signal which is acquired by use of a static magnetic field, gradient magnetic field, and RF magnetic field, said apparatus comprising one or more RF coil sets for generating said RF magnetic field with each RF coil set comprising:

a plurality of disable circuits each having a capacitor connected in parallel to a circuit containing an inductor connected serially to a diode;

a plurality of first main pass extended conductors arranged in generally the same plane and in parallel to each other and each different first extended conductor having a first and a second end;

an RF choke disposed between said first ends of said first extended conductors; and a plurality of second return pass semi-circular conductors arranged to have their ends connected to each first and second ends of said first extended conductors and generally in the same plane as the plurality of first extended conductors;

wherein one of said plurality of disable circuits is disposed connected to a location where one of said plurality of second semi-circular conductors is connected to said first end of one of said first extended conductors, and another of said plurality of disable circuits is disposed connected to a different location where another of said plurality of second semi-circular conductors is connected to a different said first end of another of said plurality of first extended conductors.

10. The apparatus of claim 9, wherein said plurality of first extended conductors each comprises a pair of parallel conductors.

11. The apparatus of claim 9, wherein said plurality of first extended conductors each comprises a planar conductor.

12. The apparatus of claim 9, wherein said plurality of second semi-circular conductors are generally semi-circular in shape with a straight conductor connecting the ends thereof.

13. The apparatus of claim 9, wherein said plurality of disable circuits are six in number with three disposed on each side of said RF choke.

14. The apparatus of claim 9, further comprising two coil sets disposed to be generally in planes parallel to each other.

15. The apparatus of claim 14, wherein said two coils sets are arranged so that the parallel first extended conductors of each set are positioned to be perpendicular to each other.

16. The apparatus of claim 9, wherein further comprising four coil sets (A,B,C,D) disposed to be generally in planes parallel to each other, with one pair (A,B) of the four sets of coils (A,B,C,D) having first parallely extended conductor of one set (A) positioned to be perpendicular to the first parallely extended conductors of another set (B), and with another pair (C,D) of the four sets of coils (A,B,C,D) having first parallely extended conductors of outs set (C) positioned to be perpendicular to the first parallely extended conductors of another set (D).

* * * * *